(12) United States Patent
Ebner

(10) Patent No.: US 7,551,023 B2
(45) Date of Patent: Jun. 23, 2009

(54) AMPLIFIER WITH LOW PASS FILTER FEEDBACK

(75) Inventor: Christian Ebner, München (DE)

(73) Assignee: National Semiconductor Germany AG, Unterhaching (DE)

( * ) Notice: Subject to any disclaimer, the term of this patent is extended or adjusted under 35 U.S.C. 154(b) by 513 days.

(21) Appl. No.: 11/257,568

(22) Filed: Oct. 25, 2005

(65) Prior Publication Data

US 2006/0097782 A1 May 11, 2006

(30) Foreign Application Priority Data

Oct. 27, 2004 (DE) .................. 10 2004 052 174

(51) Int. Cl.
*H03F 1/38* (2006.01)
(52) U.S. Cl. .................. 330/85; 330/254; 330/260; 327/307
(58) Field of Classification Search ............ 330/85, 330/254, 260; 327/307
See application file for complete search history.

(56) References Cited

U.S. PATENT DOCUMENTS

| 4,785,237 | A | 11/1988 | Cox | |
|---|---|---|---|---|
| 6,903,593 | B2* | 6/2005 | Wang | 327/307 |
| 2006/0097782 | A1* | 5/2006 | Ebner | 330/85 |

OTHER PUBLICATIONS

Lundberg, Kent H., "Internal and External Op-Amp Compensation: A Control-Centric Tutorial", Proceeding of the 2004 American Control Conference, Boston, MA, Jun. 30-Jun. 2, 2004, AACC, pp. 5197-5211.

* cited by examiner

*Primary Examiner*—Michael B Shingleton
(74) *Attorney, Agent, or Firm*—Pearne & Gordon LLP

(57) ABSTRACT

An amplifier is described which amplifies an input signal according to a defined amplification factor, and which generates an output signal. To reduce an offset fraction of the output signal the amplifier comprises a feedback path which has lowpass characteristics and which returns the output signal in a lowpass-filtered state to an input of the amplifier. The feedback path comprises an amplifier stage as well as at least one Miller capacitance connected between an input and an output of the amplifier stage.

17 Claims, 6 Drawing Sheets

AMPLIFIER WITH LOW PASS FILTER FEEDBACK

BACKGROUND TO THE INVENTION

1. Field of the Invention

The invention relates to an amplifier and a feedback unit for reducing an offset fraction in the output signal of the amplifier.

2. Description of the State of the Art

In the context of amplifiers a problem can arise in that an input offset of the amplifier (and also an offset of the input signal) can be amplified at the same time by the amplifier so that the output signal of the amplifier comprises an undesirable steady component. This problem is encountered in particular in the case of amplifiers that are designed for amplifying high-frequency signal components. In such broadband amplifiers the transistors have to be of very small dimensions so that frequency components, for example in the gigahertz range, can be amplified. This relatively small dimensioning of the transistors results in significant fluctuations in the transistor threshold voltages, and consequently a significant input offset results. When this input offset is then amplified at the same time, the steady component obtained at the output can easily reach the magnitude of the dynamic range. For example an input offset of up to 10 mV at an amplification of approximately 30 dB results in a steady component of approximately 300 mV at the output, which corresponds to roughly half of the dynamic range.

SUMMARY OF THE INVENTION

It is thus the object of the invention to provide an amplifier with improved offset suppression.

This object of the invention is met by a feedback unit for reducing an offset fraction in the output signal of an amplifier, and by an amplifier according to the main claims. Advantageous embodiments of the invention are described in the subordinate claims.

The feedback unit according to the invention causes a negative feedback of outputs of an amplifier to inputs of the amplifier so as to reduce an offset fraction in the output signal of the amplifier. The feedback unit has lowpass characteristics and comprises an amplifier stage as well as at least one Miller capacitance connected between an input and an output of the amplifier stage.

The feedback unit according to the invention is designed to feed the output signal of an amplifier to its input after lowpass filtering so that a steady component of the input signal can entirely or partially be compensated for. The limiting frequency of the lowpass filter should be selected so that only the steady component can pass through while low-frequency signal fractions are not fed back to the input. If the lowpass in the feedback unit is implemented by means of an RC element, the capacitance in the feedback path must be dimensioned so as to be correspondingly large in order to achieve an adequately low limiting frequency. Such solutions are associated with a disadvantage in that the required capacitors require a lot of space on the silicon chip.

In the feedback unit according to the invention, instead of a large capacitor an additional amplifier stage is provided, between whose inputs and outputs at least one Miller capacitor of comparatively small dimensions is connected. Since the amplifier stage amplifies an applied voltage by an amplification factor, hereinafter referred to as A2, and since to this extent a significantly higher voltage is present at the connections of the Miller capacitor, the relatively small-dimensioned Miller capacitor can store a charge quantity which corresponds to the charge of a capacitor that is larger by the factor (1+A2). Interconnecting an amplifier stage with at least one small-dimensioned capacitor thus has the same effect as a significantly larger capacitance. The space requirement of the additional amplifier stage is relatively small so that by utilising the Miller effect a significant reduction in the silicon area required by the lowpass can be achieved. In this way the feedback unit for offset suppression can be implemented so that it is smaller and more cost-effective than up to now.

It is advantageous if the feedback unit is designed as an inverting feedback unit, which feeds the low-pass filtered output signal with negative polarity back to at least one input of the amplifier. Since the fed-back signal has a reversed polarity sign when compared to the input signal, superposition of the negative feedback signal on the input signal results in achieving at least partial compensation of the input offset.

According to an advantageous embodiment of the invention the amplification stage is designed for amplifying differential signals. In order to reduce the effects of capacitive or inductive inputs, signals in the high-frequency range are preferably differential signals. In differential signal transmission two signal lines are used for transmission, wherein the high-frequency desired signal is obtained as a differential signal of the two transmitted signal components. By means of differential transmission technology all capacitive or inductive interference that simultaneously affects both signal lines can be eliminated. The feedback unit according to the invention is in particular suitable for generating a differential feedback signal from a differential output signal of an amplifier, and for feeding said feedback signal back to the input of the amplifier.

It is advantageous if the amplifier stage comprises a non-inverting input, an inverting input, a negative output and a positive output, wherein the negative output is connected to the non-inverting input by way of a first Miller capacitance, and wherein the positive output is connected to the inverting input by way of a second Miller capacitance. If a voltage u is applied to the non-inverting input, on the negative output a voltage $-A2 \times u$ appears that has been amplified by the amplification factor A2. Thus a voltage $(1+A2) \times u$ is present on the first Miller capacitance, and therefore on the first Miller capacitance a charge that is increased by the factor (1+A2) will be stored. The same applies to the second Miller capacitance.

According to an advantageous embodiment the feedback unit comprises at least one transconductance stage which operates against a resistance load. Transconductance stages convert a voltage signal into a proportional current signal. Due to their precisely determined amplification they are suitable for use in the feedback path.

According to an advantageous embodiment the limiting frequency of the lowpass characteristics is influenced by the amplification factor of the amplifier stage and the Miller capacitance, of which there is at least one. In particular, the limiting frequency of the lowpass characteristics is influenced by the effective capacitance $C_{eff} = (1+A2) \times C$, wherein A2 designates the amplification factor of the amplification stage, and C designates the Miller capacitance.

According to a further advantageous embodiment the feedback unit comprises at least one ohmic resistor which is connected in series to the amplifier stage. In this embodiment the ohmic resistor acts together with the amplifier stage and with the Miller capacitances as an RC element, wherein the limiting frequency of the lowpass is determined both by the resistor R and by the effective capacitance $C_{eff}$.

According to a further advantageous embodiment the feedback unit comprises an additional amplifier stage or attenuation stage that is connected at the outlet side of the amplifier stage. As a result of this additional amplifier stage or attenuation stage an additional amplification or attenuation A3 is looped into the feedback path. Since the loop bandwidth depends on the overall amplification in the feedback path, the loop bandwidth can be adjusted as required by varying A3.

The amplifier according to the invention is designed to amplify an input signal according to a defined amplification factor, and to generate an output signal. In order to reduce an offset fraction of the output signal the amplifier according to the invention comprises a feedback path which has lowpass characteristics and returns the output signal in a lowpass-filtered state to an input of the amplifier. In this arrangement the feedback path comprises an amplifier stage as well as at least one Miller capacitance connected between an input and an output of the amplifier stage. The design, according to the invention, of the feedback path makes possible a clear reduction in the steady component of the output signal and in this way makes it possible to better utilise the available dynamic range.

According to a preferred embodiment of the invention the amplifier is designed to superimpose on the input signal a feedback signal provided by the feedback path. As a result of the amplifier generating a superposition signal from the input signal and the feedback signal, the offset of the input signal is reduced or eliminated.

According to an advantageous embodiment the amplifier comprises first inputs for an input signal and second inputs for the feedback signal provided by the feedback path. In this embodiment of the invention, within the amplifier, a superposition signal is generated from the input signal and the feedback signal.

Another embodiment provides for the amplifier to be designed for amplifying HF signals with frequency components in the GHz range.

Furthermore, it can be provided for the limiting frequency of the lowpass characteristics to be influenced by the amplification factor of the amplifier stage and of the Miller capacitance, of which there is at least one.

According to a first preferred embodiment of the invention the input signal of the amplifier stage is fed back to an input of the amplifier. In this embodiment of the invention the amplifier stage is not looped into the feedback path. The amplification factor A2 of the amplifier stage has thus no influence on the loop bandwidth in the feedback path. In particular, this embodiment of the invention prevents any increase in the loop bandwidth, which would put a downward limit on the usable frequency spectrum.

According to a second embodiment of the invention an output signal of the amplifier stage is fed back to an input of the amplifier. In this embodiment of the invention the amplifier stage is looped into the feedback path; and the amplification factor A2 of the amplifier stage influences the loop bandwidth.

According to a further advantageous embodiment of the invention an output of the amplifier stage is coupled to an input of the amplifier by way of an additional amplifier stage or attenuation stage connected at the outlet side of the amplifier stage. By means of this additional amplifier stage or attenuation stage with the amplification factor A3 the loop bandwidth can be influenced, for example in order to again enlarge the useable frequency range. In particular, by joining an additional amplifier stage or attenuation stage the influence which the amplifier stage has on the loop bandwidth can be compensated for.

Preferably, the additional amplifier stage or attenuation stage is implemented as a transconductance stage whose output current works against terminating resistors of input lines of the amplifier. By means of a transconductance stage it becomes possible to very precisely adjust the amplification or attenuation A3. The output current of the transconductance stage causes an additional voltage drop at the terminating resistors. This results in superposition of the input signal with this voltage drop caused by the feedback signal. The superposition signal generated in this way, which comprises a significantly reduced steady component, is then fed to the amplifier.

BRIEF DESCRIPTION OF THE DRAWINGS

Below, the invention is described in further detail with reference to several embodiments shown in the drawing. The following are shown.

DESCRIPTION OF EMBODIMENTS

Figure 1:
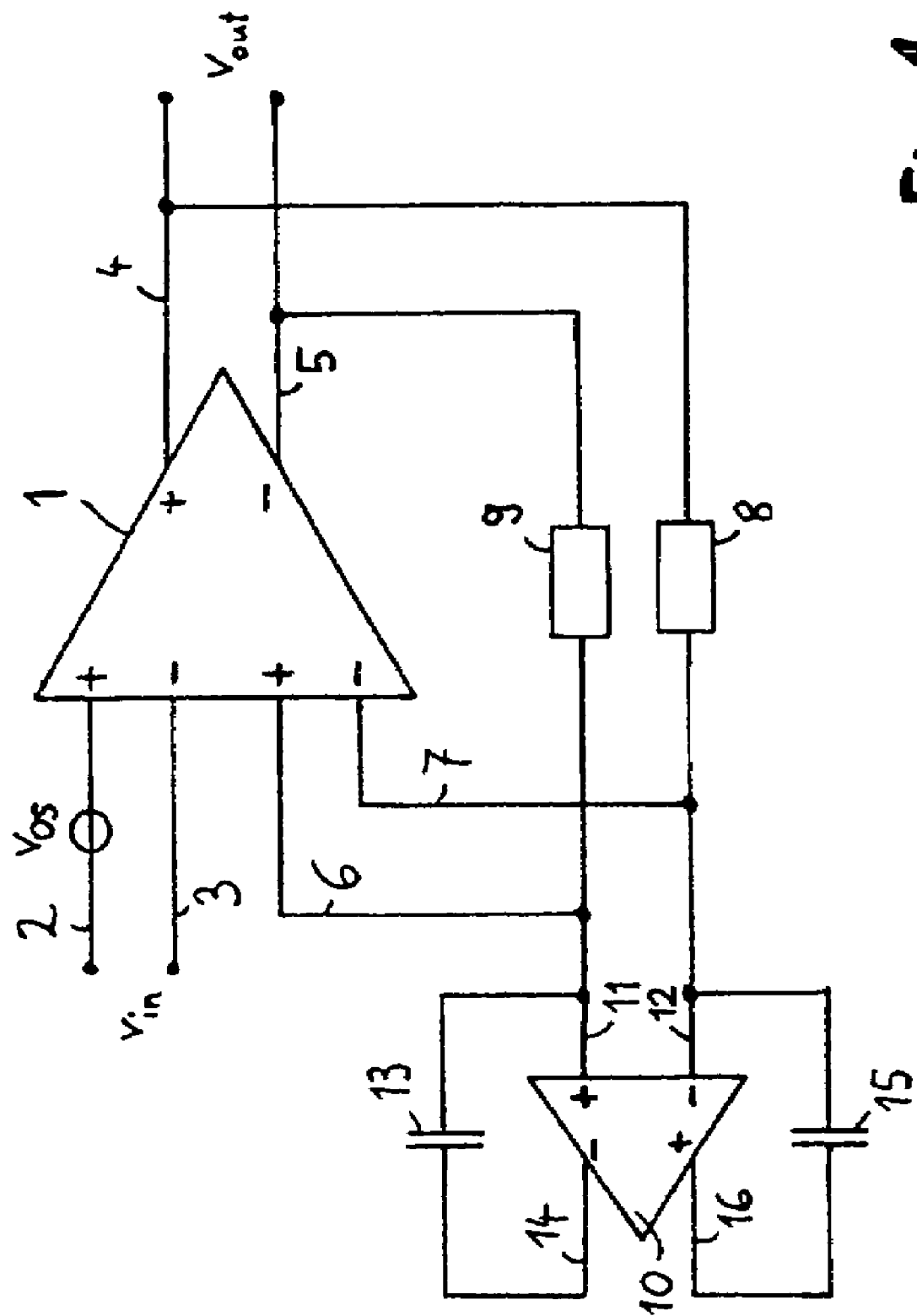
FIG. 1 a first embodiment of the invention.

FIG. 1 shows a first embodiment of an amplifier according to the invention. Amplifiers are associated with a problem in that an input offset $v_{os}$ is amplified at the same time, which results in an undesired steady component in the output signal of the amplifier. In extreme cases an amplifier can even be overloaded by its own offset. This problem occurs in particular in the case of broadband amplifiers with bandwidths of for example 8.5 GHz, because due to the high-frequency signal fractions the transistors have to be very small. In such amplifiers the statistical fluctuations in the transistor threshold voltages cause an input offset of up to 10 mV. With amplification of approximately 30 dB, this would lead to a steady component of approximately 300 mV at the output, i.e. approximately half of the dynamic range.

The amplifier 1 shown in FIG. 1 comprises first inputs 2, 3, to which the input signal $v_{in}$ is applied. The input signal $v_{in}$ is amplified by the amplifier 1 according to a defined amplification factor A1, and the amplified output signal $v_{out}$ can be tapped at the outputs 4, 5. In order to at least partly compensate for the offset $v_{os}$ of the input signal, a negative feedback path is provided which feeds back the output signal $v_{out}$ with reversed polarity to the second inputs 6, 7 of the amplifier 1. To this effect the positive output 4 of the amplifier 1 is connected to the negative second input 7 of the amplifier 1 by way of the resistor 8, while the negative output 5 of the amplifier 1 is connected to the positive second input 6 of the amplifier 1 by way of the resistor 9. Furthermore, the feedback path comprises an amplifier stage 10 with a defined amplification factor A2. The positive input 11 of the amplifier stage 10 is connected to the second positive input 6 of the amplifier 1 as well as to the resistor 9, while the negative input 12 is connected to the second negative input 7 of the amplifier 1 as well as to the resistor 8. The positive input 11 of the amplifier stage 10 is connected to the negative output 14 of the amplifier stage 10 by way of a first Miller capacitor 13, while the negative input 12 of the amplifier stage 10 is connected to the positive output 16 of the amplifier stage 10 by way of a second Miller capacitor 15.

In the circuit arrangement shown in FIG. 1 the steady component of the output signal $v_{out}$ is fed back with reversed polarity to the second inputs 6, 7 of the amplifier 1, and in the amplifier the input signal $v_{in}$ is superimposed on said steady component. In this way the input offset of the amplifier, which input offset is shown in FIG. 1 by the voltage source $v_{os}$, is at least partially suppressed. To prevent suppression of relevant signal fractions the feedback path has to comprise lowpass characteristics whose limiting frequency has to be selected so as to be correspondingly low.

In the embodiment of the invention that is shown in FIG. 1, the input signal $v_{in}$, the output signal $v_{out}$ and the feedback signal are differential signals. Since the signal is transmitted as a differential signal, any interference that uniformly affects both signal lines can be eliminated.

In order to reduce the limiting frequency $f_{grenz}$ of the lowpass in the feedback path, the resistors 8, 9 could be increased. However, large resistors, i.e. small conductance values in integrated circuits, cause increased sensitivity to leakage currents and to interference input. It is therefore advantageous to increase the effective capacity in the lowpass in order to arrive in this way at a reduction in the limiting frequency $f_{grenz}$.

In the embodiment of the invention shown in FIG. 1 the effective capacitance in the lowpass is increased by utilising the Miller effect. To explain the Miller effect we assume that on the positive input 11 of the amplifier stage 10 an input voltage $u_1$ is present. This input voltage $u_1$ is amplified by the amplification factor A2 in the amplifier stage 10 so that a voltage $-A2 \times u_1$ is output at the negative output 14. In this respect the voltage $u_1$ is present at the connection of the Miller capacitor 13, which connection is connected to the positive input 11 of the amplifier stage, while the voltage $-A2 \times u_1$ is present at the connection of the Miller capacitor 13, which connection is connected to the negative output 14 of the amplifier stage. The voltage U, which drops above the Miller capacitor, is thus $U=u_1 \times (1+A2)$, and the charge Q that has been stored by the Miller capacitor 13 is calculated as follows:

$$Q = C \cdot U = C \cdot (1+A2) \cdot u_1$$

If instead of the amplifier stage 10 and the Miller capacitor 13 that has been connected between the input and the output of the amplifier an effective capacitance $C_{eff}$ were to be provided, then this capacitance $C_{eff}$ would have to be able to store the charge Q calculated above if the voltage $u_1$ is present at said capacitance. The value of this substitute capacitance is thus:

$$C_{eff} = \frac{Q}{u_1} = \frac{C \cdot (1+A2) \cdot u_1}{u_1} = C \cdot (1+A2)$$

The arrangement comprising an amplifier stage 10 and a Miller capacitor 13 thus acts like a significantly larger effective capacitance $C_{eff}=C \times (1+A2)$. The same effect is obtained in relation to the second Miller capacitor 15, which is connected between the negative input 12 and the positive output 16 of the amplifier stage 10. In the solution according to the invention, by utilising the Miller effect, relative large effective capacitances $C_{eff}$ can be achieved by connecting in parallel an amplifier stage 10 with a first and a second Miller capacitor, wherein the ratio of the relatively small Miller capacitors to the effective capacitances $C_{eff}$ is substantially determined by the amplification factor A2 of the amplifier stage 10.

Due to the high effective capacitances $C_{eff}$ in the feedback path the limiting frequency $f_{grenz}$ becomes sufficiently low so that only the steady component is fed back from the outputs to the inputs of the amplifier 1. Signal fractions above the limiting frequency $f_{grenz}$ are not fed back to the input of the amplifier 1.

In the solution according to the invention the area required for the capacitance is reduced by a factor of $1/(1-A2)$ because instead of the relatively large area for $C_{eff}$ only the comparatively small area for the Miller capacitors 13 and 15 has to be provided. This is advantageous in particular if the circuit arrangement shown in FIG. 1 is implemented by means of an integrated circuit, because as a result of the greatly reduced area requirement for the capacitance in the feedback path the per unit cost can be significantly reduced.

Figure 2:
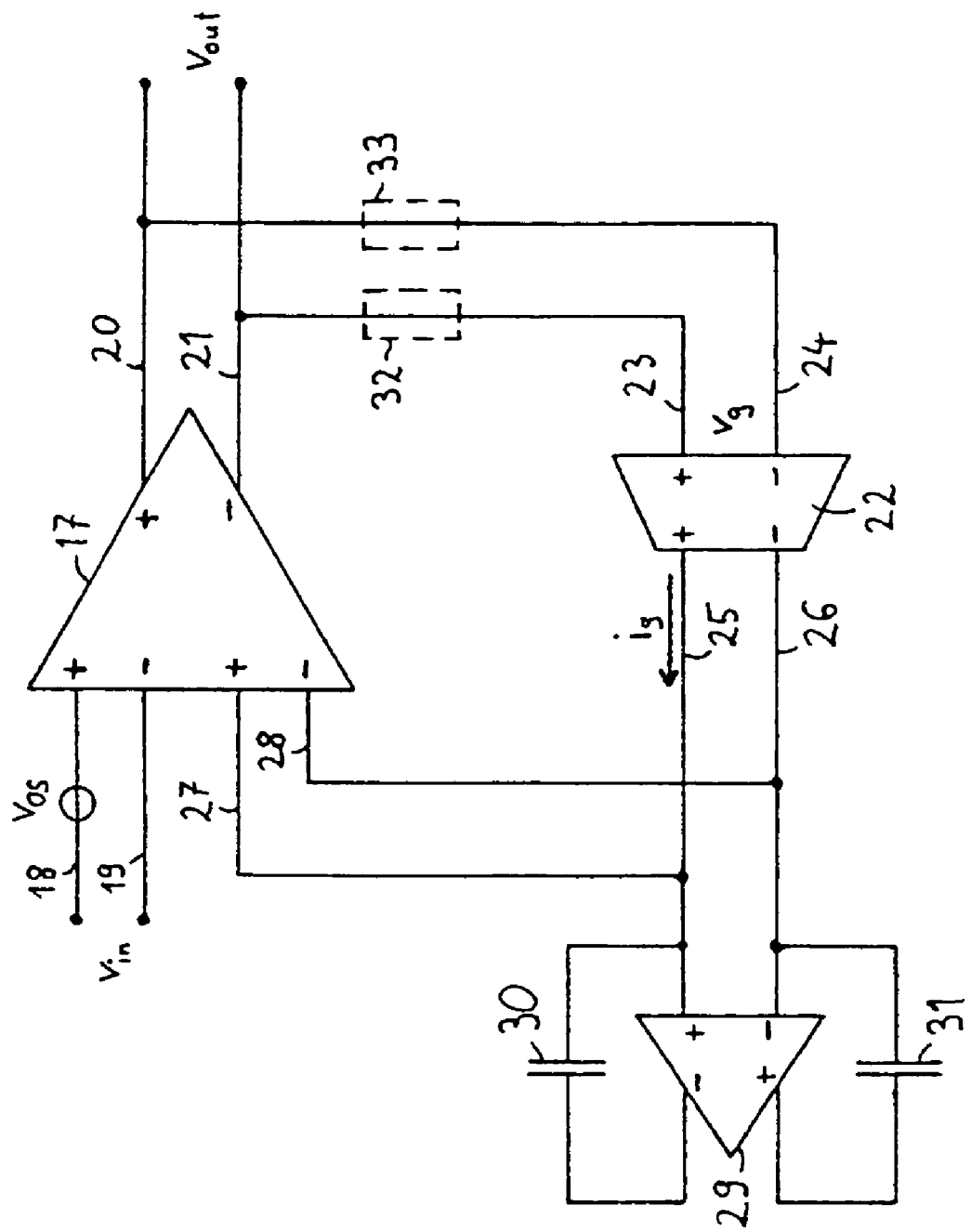
FIG. 2 a second embodiment of the invention, in which the feedback path comprises a transconductance.

FIG. 2 shows a second embodiment of the invention. The amplifier 17 comprises first inputs 18, 19 on which the input signal $v_{in}$ is present. The offset of the input signal $v_{in}$ is shown by a voltage source $v_{os}$ at the positive first input 18 of the amplifier 17. At the outputs 20, 21 of the amplifier 17, the input signal $v_{in}$, amplified by the amplification factor A1, is output as an output signal $V_{out}$. As is the case in the first embodiment shown in FIG. 1, in the second embodiment of the invention, too, the input signal $v_{in}$, the output signal $v_{out}$ and the feedback signal are differential signals which in each case comprise a positive and a negative signal component. The actual input signal or output signal is then obtained in each case as the difference between the two signal components.

In the embodiment shown in FIG. 2 the feedback path comprises a transconductance stage 22, which is also variously referred to as an operational tranconductance amplifier (OTA), transconductance element or a transconductor. The transconductance stage converts a voltage signal $v_g$ that is present at the inputs 23, 24 to a corresponding current signal $i_g$ at the output of the tranconductance stage 22. In this arrangement $i_g = g_m \times v_g$ applies, wherein $g_m$ designates the transconductance of the transconductance stage 22. The outputs 25, 26 of the transconductance stage 22 are connected to the second inputs 27, 28 of the amplifier 17 such that negative feedback results: the positive output 20 of the amplifier 17 is fed back to the negative second input 28, while the negative output 21 is connected to the positive second input 27.

In order to achieve lowpass characteristics in the feedback path, high-frequency fractions of the signal obtained at the outputs 25, 26 are connected to mass by way of effective capacitances, wherein the effective capacitances are again implemented by means of an amplifier 29 and Miller capacitors 30, 31. The Miller capacitor 30 connects the positive input to the negative output of the amplifier 29, while the Miller capacitor 31 connects the negative input to the positive output. The effective capacitance $C_{eff}$ is $C_{eff}=C \times (1+A2)$, wherein A2 designates the amplification factor of the amplifier 29, and wherein C designates the capacitance of the Miller capacitors 30, 31.

Correct dimensioning of the circuit shown in FIG. 2 may require the provision of additional resistors 32, 33. The resistor 32 connects the negative output 21 of the amplifier 17 to the positive input 23 of the transconductance stage 22, while the resistor 33 connects the positive output 20 of the amplifier 17 to the negative input 24 of the transconductance stage 22. Since, depending on the design of the circuit shown in FIG. 2, the resistors 32, 33 can also be left out, they are shown in dashed lines.

Figure 3:
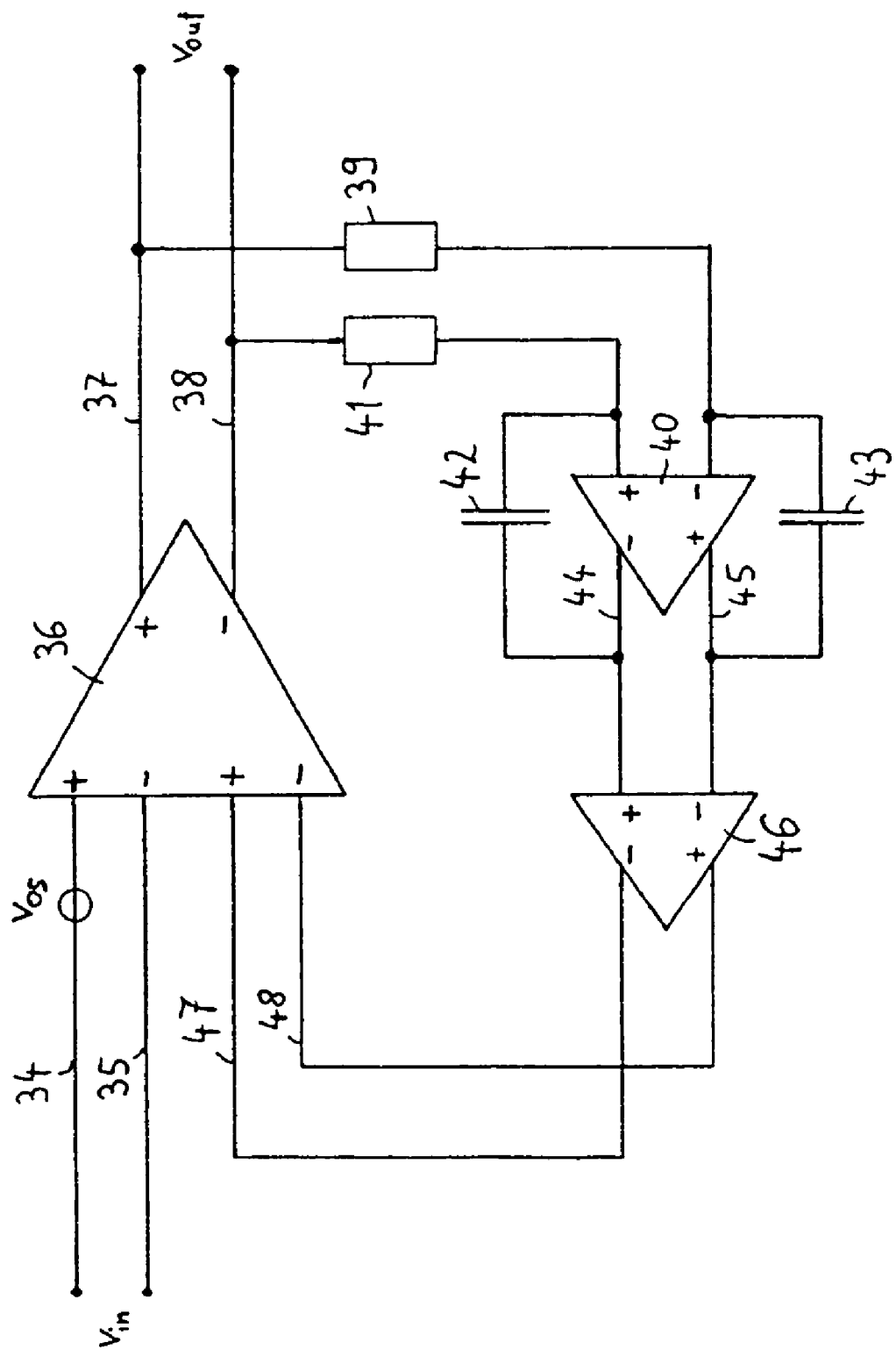
FIG. 3 a third embodiment of the invention, in which the feedback path comprises an amplifier stage and an additional attenuation stage.

FIG. 3 shows a further embodiment of the invention. An input signal $v_{in}$ with an input offset $v_{os}$ is present at first inputs 34, 35 of the amplifier 36. At the outputs 37, 38 of the amplifier 36 the amplified output signal $v_{out}$ can be tapped. In order to implement a negative feedback path the positive output 37 is connected to a negative input of an amplifier stage 40 by way of a resistor 39, while the negative output of the amplifier 38 is connected to a positive input of the amplifier stage 40 by way of a resistor 41. A first Miller capacitor 42 connects the negative output to the positive input of the amplifier stage 40, while a second Miller capacitor 43 connects the positive output to the negative input of the amplifier stage 40. In accordance with the above-described Miller effect the Miller capacitors 42, 43 together with the amplifier stage 40 act like effective capacities $C_{eff}$, which are larger than the capacity C of the Miller capacitors 42, 43 by a factor of (1+A2). The effective capacities $C_{eff}$ are used to connect higher frequency components to mass.

It should be noted that with higher frequency components the Miller effect is less pronounced than it is with lower frequency components. To nevertheless be able to effectively suppress the higher frequency components in the feedback path, the fact that the amplifier stage 40 acts as a lowpass at precisely these higher frequency components can be used to advantage. For this reason, in the embodiment shown in FIG. 3, the signal that is fed back to the amplifier 36 is not tapped at the inputs but instead at the outputs 44, 45 of the amplifier stage 40. In this way, higher frequency components, in which the Miller effect starts to lose effectiveness, are already suppressed by the amplifier stage 40. However, this measure introduces additional amplification A2 in the feedback path. In order to compensate for this amplification A2 the feedback path additionally comprises an attenuation stage 46. The negative output 44 of the amplifier stage 40 is connected to the positive input of the attenuation stage 46, while the positive output 45 of the amplifier stage 40 is connected to the negative input of the attenuation stage 46. The signals at the output of the attenuation stage 46, which signals have been attenuated by the factor A3, are connected to the second inputs 47, 48 of the amplifier 36. In this arrangement the negative output of the attenuation stage 46 is connected to the positive second input 47, while the positive output is connected to the negative second input 48.

Figure 4:
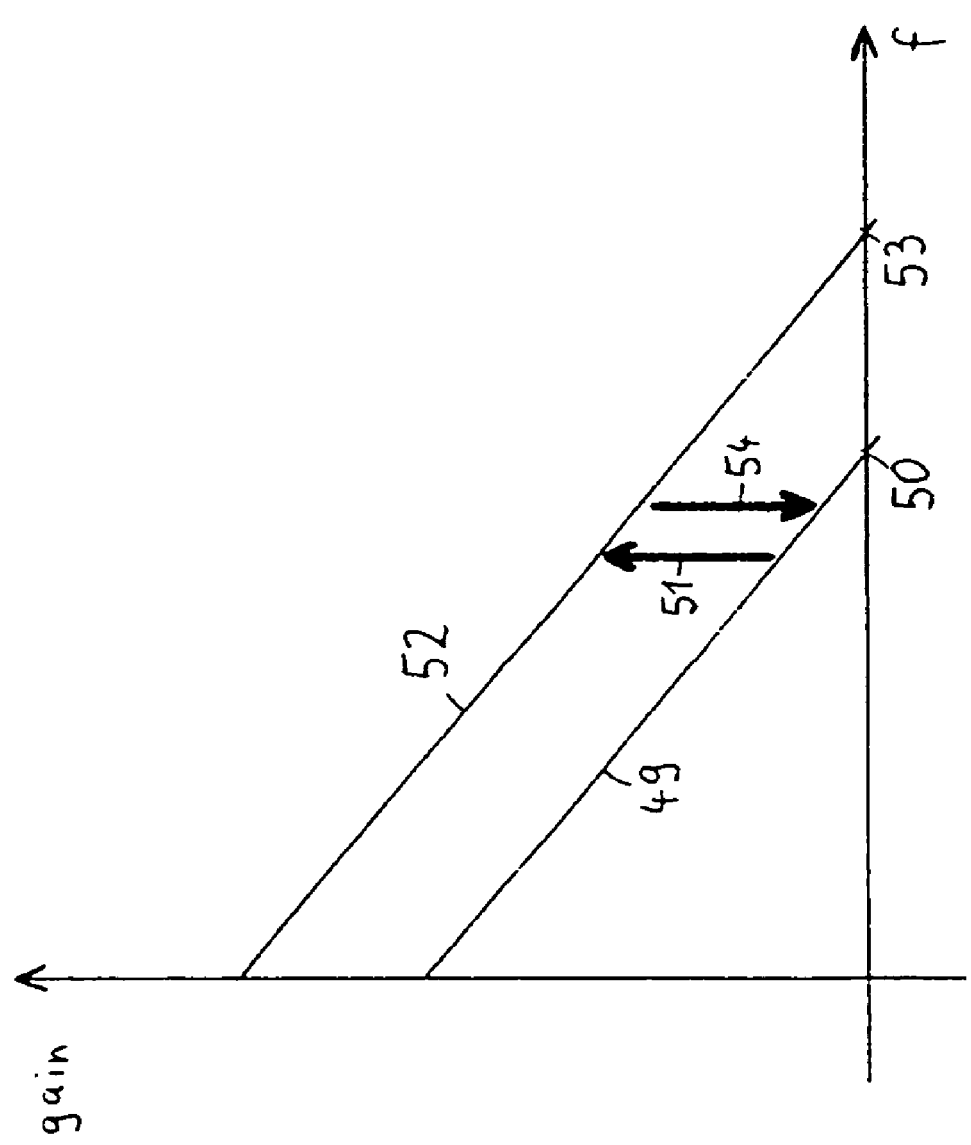
FIG. 4 a diagram of the lowpass characteristics of the feedback path, illustrating the influence which amplification A2 has on the loop bandwidth.

Below, with reference to FIG. 4, an explanation is provided of the advantages of integrating an additional attenuation stage in the feedback path in the embodiment shown in FIG. 3. In FIG. 4 the amplification of the feedback path is logarithmically illustrated as a function of the frequency. If the feedback path does not comprise additional amplification A2, lowpass characteristics 49 result. The intersection 50 of the lowpass characteristics 49 and the frequency axis corresponds to the loop bandwidth, which could for example be around 20 kHz. The loop bandwidth is the rate at which the closed-loop control circuit determined by the feedback path operates. By inserting additional amplification A2 in the feedback path the lowpass characteristics 49 are shifted upward (51) so that a change in the lowpass characteristics 52 results. This upward shift of the lowpass characteristics results in the intersection of the lowpass characteristics and the frequency axis being shifted to the right so that a new intersection 53 results. However, this increase in the loop bandwidth, caused by the amplification A2, is not desirable because it results in a restriction of the usable frequency spectrum. By inserting additional attenuation A3 the changed lowpass characteristics 52 can be lowered (54) and thus the original loop bandwidth is obtained again.

Figure 5:
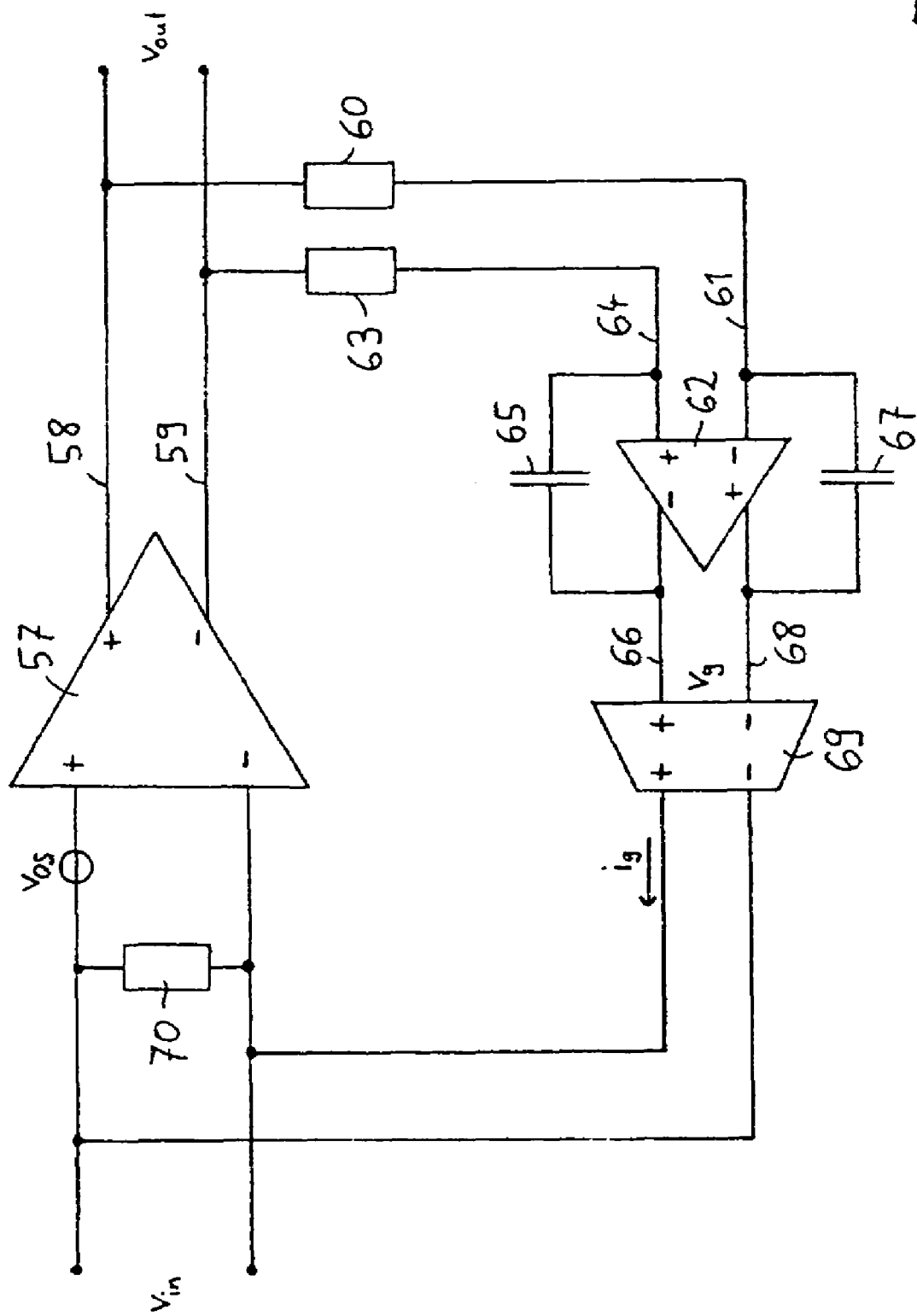
FIG. 5 a fourth embodiment of the invention.

In the embodiments described so far, the input signal and the feedback signal were fed to the amplifier by way of separate first and second inputs. The two signals were then superimposed within the amplifier. In contrast to this, the amplifier 57 shown in FIG. 5 only comprises one pair of inputs 55, 56. In this embodiment of the invention the differential feedback signal is superimposed on the differential input signal $v_{in}$ before said differential input signal is fed to the inputs 55, 56 of the amplifier 57. In this embodiment the amplifier 57 therefore has no additional inputs for the feedback signal. The amplified output signal $v_{out}$ can be tapped at the outputs 58, 59 of the amplifier 57. To generate a negative feedback the positive output 58 of the amplifier 57 is connected to a negative input 61 of an amplifier stage 62 by way of a resistor 60, while the negative output 59 of the amplifier 57 is connected to the positive input 64 of the amplifier stage 62 by way of a resistor 63. A first Miller capacitor 65 is connected between the positive input 64 and the negative output 66 of the amplifier stage 62. The second Miller capacitor 67 is connected between the negative input 61 and the positive output 68 of the amplifier stage 62. The resistors 60, 63 together with the effective capacities $C_{eff}$ that have been generated by the Miller effect act as a lowpass that suppresses frequencies above the limiting frequency $f_{grenz}=1/(R\times C_{eff})$. In order to superimpose the input signal on the lowpass-filtered feedback signal, the voltage signal $u_g$ that can be tapped at the outputs 66, 68 of the amplifier stage 62 is converted to a current signal $i_g$ by a transconductance stage 69. The input lines for the differential input signal $v_{in}$ are terminated by a terminating resistor 70. The additional current $i_g$ through the terminating resistor 70 causes an additional voltage drop which is superimposed on the input signal $v_{in}$. As a result of this superposition of the lowpass-filtered feedback signal on the input signal $v_{in}$, the input offset $v_{os}$ can, at least to a large extent, be suppressed.

Figure 6:
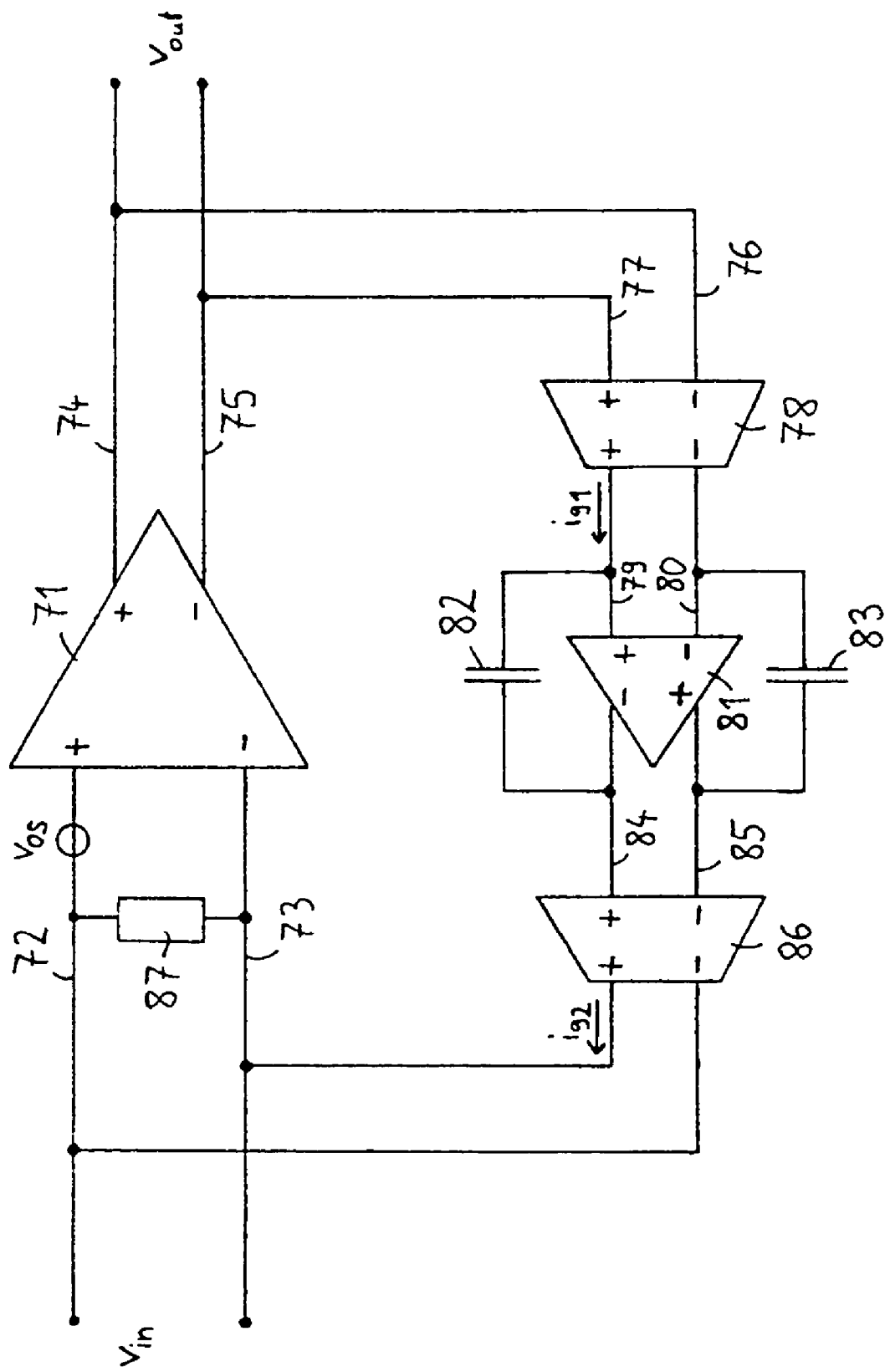
FIG. 6 a fifth embodiment of the invention.

In the embodiment shown in FIG. 6, too, the amplifier 71 comprises a pair of differential inputs 72, 73, to which a superposition signal is applied that is generated by superimposing the feedback signal on the input signal $v_{in}$. In a way that differs from the embodiment shown in FIG. 5 the outputs 74, 75 of the amplifier 71 are connected to inputs 76, 77 of a first transconductance stage 78. Corresponding to the transconductance $g_{m1}$ the input signal of the first transconductance stage 78 is converted into a current signal $i_{g1}$ that is proportional to the above, wherein the current signal $i_{g1}$ is fed to the inputs 79, 80 of the amplifier 81. The inputs 79, 80 of the amplifier 81 are connected to the outputs 84, 85 by way of first and second Miller capacitors 82, 83. Corresponding to the transconductance $g_{m2}$, by means of a second transconductance stage 86 the voltage signal present at the outputs 84, 85 is converted to a current $i_{g2}$ which then works against the terminating resistance 87. In this way superposition of the negative feedback signal on the input signal $v_{in}$ can be generated.

The invention claimed is:

1. A feedback unit for the negative feedback of outputs (4,5) of an amplifier to inputs (2, 3, 6, 7) of the amplifier so as to reduce an offset fraction in the output signal of the amplifier, wherein the feedback unit has a lowpass characteristics and comprises an amplifier stage (10) whose input (11,12) is connected to the outputs (4,5) of the amplifier (1) as well as at least one Miller capacitance (13, 15) connected between an input (11, 12) and an output (14, 16) of the amplifier stage and influencing the lowpass characteristics, characterized in that the input (11,12) of the amplifier stage (10) is directly connected to the inputs (6,7) of the amplifier (1) so that the input signal of the amplifier stage (10) is fed to the inputs (6, 7) of the amplifier.

2. The feedback unit according to claim 1, characterised in that the feedback unit is designed as an inverting feedback unit, which feeds the low-pass filtered output signal with negative polarity back to at least one input of the amplifier.

3. The feedback unit according to claim 1, characterised in that the amplification stage is designed for amplifying differential signals.

4. The feedback unit according to claim 1, characterised in that the amplifier stage comprises a non-inverting input, an inverting input, a negative output and a positive output, wherein the negative output is connected to the non-inverting input by way of a first Miller capacitance, and wherein the positive output is connected to the inverting input by way of a second Miller capacitance.

5. The feedback unit according to claim 1, characterised in that the feedback unit comprises at least one transconductance stage which operates against a resistance load.

6. The feedback unit according to claim 1, characterised in that the limiting frequency of the lowpass characteristics is influenced by the effective capacitance $(1+A2) \times C$, wherein A2 designates the amplification factor of the amplification stage, and C designates the Miller capacitance.

7. The feedback unit according to claim 1, characterised by at least one ohmic resistor which is connected in series to the amplifier stage.

8. The feedback unit according to claim 1, characterised in that the feedback unit comprises an additional amplifier stage or attenuation stage that is connected at the outlet side of the amplifier stage.

9. The feedback unit according to claim 8, characterised in that the additional amplifier stage or attenuation stage is implemented as a transconductance stage whose output current works against input resistors of inputs of the amplifier.

10. An amplifier (1) which amplifies an input signal according to a defined amplification factor and generates an output signal, and which in order to reduce an offset fraction of the output signal comprises a feedback path which has lowpass characteristics and returns the output signal in a lowpass-filtered state to an input (6, 7) of the amplifier (1), wherein the feedback path comprises an amplifier stage (10) whose input (11,12) is connected to the outputs (4,5) of the amplifier (1) as well as at least one Miller capacitance (13, 15) connected between an input (11, 12) and an output (14, 16) of the amplifier stage and influencing the lowpass characteristics, characterized in that the input (11,12) of the amplifier staQe (10) is directly connected to the inputs (6,7) of the amplifier (1) so that the input signal of the amplifier stage (10) is fed to the inputs (6, 7) of the amplifier (1).

11. The amplifier according to claim 10, characterised in that the feedback path is an inverting feedback path which feeds back the lowpass filtered output signal with negative polarity to the input of the amplifier.

12. The amplifier according to claim 10, characterised in that the amplifier is designed to superimpose on the input signal a feedback signal provided by the feedback path.

13. The amplifier according to claim 10, characterised in that the amplifier comprises first inputs for an input signal and second inputs for a feedback signal provided by the feedback path.

14. The amplifier according to claim 10, characterised in that the amplifier is designed to amplify differential input signals.

15. The amplifier according to claim 10, characterised in that the amplifier stage comprises a non-inverting input, an inverting input, a negative output and a positive output, wherein the negative output is connected to the non-inverting input by way of a first Miller capacitance, and wherein the positive output is connected to the inverting input by way of a second Miller capacitance.

16. The amplifier according to claim 10, characterised in that the feedback path comprises at least one ohmic resistor, which is connected in series to the amplifier stage.

17. The amplifier according to claim 10, characterised in that an input signal of the amplifier stage is fed back to an input of the amplifier.

* * * * *

UNITED STATES PATENT AND TRADEMARK OFFICE
CERTIFICATE OF CORRECTION

| | |
|---|---|
| PATENT NO. | : 7,551,023 B2 |
| APPLICATION NO. | : 11/257568 |
| DATED | : June 23, 2009 |
| INVENTOR(S) | : Christian Ebner |

It is certified that error appears in the above-identified patent and that said Letters Patent is hereby corrected as shown below:

On the Title page, item [56] under Other Publications, line 3, please delete "Jun. 2, 2004" and insert therefor --July 2, 2004--.

At Column 10, line 9, please delete "staQe" and insert therefor --stage--.

Signed and Sealed this

Fifteenth Day of September, 2009

David J. Kappos
*Director of the United States Patent and Trademark Office*